(12) United States Patent
Hirai

(10) Patent No.: US 6,740,900 B2
(45) Date of Patent: May 25, 2004

(54) ORGANIC THIN-FILM TRANSISTOR AND MANUFACTURING METHOD FOR THE SAME

(75) Inventor: Katsura Hirai, Hino (JP)

(73) Assignee: Konica Corporation (JP)

( * ) Notice: Subject to any disclaimer, the term of this patent is extended or adjusted under 35 U.S.C. 154(b) by 0 days.

(21) Appl. No.: 10/371,118

(22) Filed: Feb. 21, 2003

(65) Prior Publication Data
US 2003/0160235 A1 Aug. 28, 2003

(30) Foreign Application Priority Data
Feb. 27, 2002 (JP) ........................................ 2002-051248

(51) Int. Cl.⁷ .......................... H01L 35/24; H01L 51/00
(52) U.S. Cl. .............................. 257/40; 257/59; 257/72
(58) Field of Search ............................... 257/40, 59, 72, 257/350, 642

(56) References Cited

U.S. PATENT DOCUMENTS 5,705,826 A * 1/1998 Aratani et al. ............... 257/40
5,892,244 A * 4/1999 Tanaka et al. ................ 257/40
6,344,662 B1 * 2/2002 Dimitrakopoulos et al. .. 257/40
6,635,508 B2 * 10/2003 Arai et al. .................... 438/99

* cited by examiner

Primary Examiner—Wael Fahmy
Assistant Examiner—Hoai Pham
(74) Attorney, Agent, or Firm—Muserlian, Lucas and Mercanti

(57) ABSTRACT

There is described an organic thin-film transistor fabricated on a substrate. The organic thin-film transistor includes a first insulating layer formed on the substrate; an organic semiconductor layer formed on the first insulating layer; a second insulating layer formed on the organic semiconductor layer; a first through-hole bored through the second insulating layer; a second through-hole bored through the second insulating layer; a source electrode embedded in the first through-hole, a depth of which is equal to or greater than a thickness of the second insulating layer so that the source electrode contacts the organic semiconductor layer; a drain electrode embedded in the second through-hole, a depth of which is equal to or greater than a thickness of the second insulating layer so that the drain electrode contacts the organic semiconductor layer; and a gate electrode embedded in the first insulating layer.

4 Claims, 4 Drawing Sheets

ORGANIC THIN-FILM TRANSISTOR AND MANUFACTURING METHOD FOR THE SAME

BACKGROUND OF THE INVENTION

The present invention relates to an organic thin-film transistor and a manufacturing method for the organic thin-film transistor.

With the spread of information terminal equipment, there are increasing needs for a flat panel display as a display for a computer. Further, with the progress of computerization, there are increasing opportunities wherein information which has so far been offered in a sheet of paper medium is electronized to be offered, and there are increasing needs for an electronic paper or digital paper as a display medium for a mobile that is thin and light in weight and can be carried easily.

In general, in a flat type display device, a display medium is formed by using an element wherein liquid crystal, organic EL or electrophoresis is used. In the case of this display medium, a leading technology is one that employs an active driving element composed of thin-film transistor (TFT) as an image driving element.

TFT element is manufactured by forming successively a semiconductor thin-film such as a-Si (amorphous silicon) or P-Si (poly silicon) on a glass substrate, or forming successively a metallic thin-film such as a source electrode, a drain electrode and a gate electrode on a substrate. For manufacturing of flat panel display using the TFT, highly accurate photolithograph process is generally needed in addition to a thin-film forming process requiring a vacuum system facilities such as CVD and spattering and a high temperature processing process, resulting in extremely high load including facility cost and running cost. In addition, recent needs for a large-sized screen for display make the cost to be extremely huge.

As a technology to compensate for demerit of the conventional TFT element, research and development of organic TFT element employing an organic semiconductor material are advanced intensively in recent years. Since this organic TFT element can be manufactured in a low temperature process, it is possible to use a resin substrate, which is light in weight and is hardly broken, and it is said that a flexible display employing a resin film as a support may be realized. Further, by using an organic semiconductor material, which can be manufactured by a wet process such as printing or coating under atmospheric pressure, it is possible to realize a display which is excellent in productivity and is extremely low in cost.

As a required condition in an organic TFT technology, there is given highly accurate patterning for a channel. In the aforesaid patent, TOKKAIHEI No. 10-190001 and TOKKAI No. 2000-307172, molding of a channel portion requires highly accurate photolithography which causes problems that patterning is difficult, and manufacturing processes are complicated and huge facilities are required in the processes accordingly, resulting in high cost. The invention makes highly accurate patterning to be possible in a simple way, and solves the aforesaid problems greatly.

Further, as an organic thin-film transistor, there is disclosed, for example, an all-polymer type organic TFT technology in WO01/47043. Though a simplified process by ink-jetting or coating is proposed, there are problems that carrier mobility of an element is low, gate voltage is high, an electric current value under the state of switching-on is low, and an ON/OFF value of an electric current is low.

Further, there is a problem that characteristics of a transistor are deteriorated by influences of a coating solvent used in the process and of a component contained in a developer solution in the processes succeeding the formation of an organic semiconductor layer, such as, for example, a coating process of light-sensitive resin material for patterning or a developing process for a light-sensitive resin layer.

SUMMARY OF THE INVENTION

To overcome the abovementioned drawbacks in conventional organic thin-film transistors and conventional methods for manufacturing them, it is an object of the present invention to provide an organic thin-film transistor, which is manufactured trough an accurate patterning process at low cost without requiring complicated manufacturing processes and in which carrier mobility is high, gate voltage can be lowered, an electric current value is high under the state of switching ON, an ON/OFF value of an electric current is high accordingly and driving frequency is high. Further, it is another object of the present invention to provide a manufacturing method for the organic thin-film transistor, which makes it possible to suppress the deterioration of the characteristics of the organic thin-film transistor.

Accordingly, to overcome the cited shortcomings, the abovementioned objects of the present invention can be attained by organic thin-film transistors and methods for fabricating them described as follow.

(1) An organic thin-film transistor fabricated on a substrate, comprising: a first insulating layer formed on the substrate; an organic semiconductor layer formed on the first insulating layer; a second insulating layer formed on the organic semiconductor layer; a first through-hole bored through the second insulating layer; a second through-hole bored through the second insulating layer; a source electrode embedded in the first through-hole, a depth of which is equal to or greater than a thickness of the second insulating layer so that the source electrode contacts the organic semiconductor layer; and a drain electrode embedded in the second through-hole, a depth of which is equal to or greater than a thickness of the second insulating layer so that the drain electrode contacts the organic semiconductor layer.

(2) The organic thin-film transistor of item 1, further comprising: a gate electrode embedded in the first insulating layer.

(3) The organic thin-film transistor of item 1, wherein the second insulating layer is made of a photosensitive material.

(4) The organic thin-film transistor of item 1, wherein the second insulating layer is a coating film formed by applying a solvent, which includs a water as a main ingredient.

(5) An organic thin-film transistor fabricated on a substrate, comprising: a first wiring electrode formed on the substrate; a second wiring electrode formed on the substrate; an organic semiconductor layer formed on the substrate so as to cover the first wiring electrode and the second wiring electrode; a first through-hole bored through the organic semiconductor layer in such a manner that a part of the first wiring electrode is exposed in the first through-hole; a second through-hole bored through the organic semiconductor layer in such a manner that a part of the second wiring electrode is exposed in the second through-hole; a source electrode embedded in the first through-hole so that the source electrode is electronically coupled to the first wiring electrode; a drain electrode embedded in the second through-hole so that the drain electrode is electronically coupled to the second wiring electrode; a gate insulating layer formed on the organic semiconductor layer so as to cover the organic semiconductor layer, the source electrode embedded in the first through-hole and the drain electrode embedded in the second through-hole; and a gate electrode formed on the gate insulating layer.

(6) An organic thin-film transistor fabricated on a substrate, comprising: a first wiring electrode formed on the substrate; a second wiring electrode formed on the substrate; an insulating layer formed on the substrate so as to cover the first wiring electrode and the second wiring electrode; an organic semiconductor layer formed on the insulating layer; a first through-hole bored through the insulating layer in such a manner that a part of the first wiring electrode is exposed in the first through-hole; a second through-hole bored through the insulating layer in such a manner that a part of the second wiring electrode is exposed in the second through-hole; a source electrode embedded in the first through-hole so that the source electrode is electronically coupled to the first wiring electrode; a drain electrode embedded in the second through-hole so that the drain electrode is electronically coupled to the second wiring electrode; a gate insulating layer formed on the organic semiconductor layer so as to cover the organic semiconductor layer, the source electrode embedded in the first through-hole and the drain electrode embedded in the second through-hole; and a gate electrode formed on the gate insulating layer.

(7) The organic thin-film transistor of item 6, wherein the first through-hole and the second through-hole are bored through both the insulating layer and the organic semiconductor layer.

(8) A method for fabricating an organic thin-film transistor on a substrate, comprising the steps of: forming a gate electrode on a substrate; forming a first insulating layer on the substrate so as to cover the gate electrode; forming an organic semiconductor layer on the first insulating layer; forming a second insulating layer on the organic semiconductor layer; boring a first through-hole through the second insulating layer; boring a second through-hole through the second insulating layer; embedding a source electrode into the first through-hole, a depth of which is equal to or greater than a thickness of the second insulating layer so that the source electrode contacts the organic semiconductor layer; and embedding a drain electrode into the second through-hole, a depth of which is equal to or greater than a thickness of the second insulating layer so that the drain electrode contacts the organic semiconductor layer.

(9) The method of item 8, wherein, in the embedding steps for both the source electrode and the drain electrode, ink particles, of a solution or a dispersion liquid containing an electrode material, are emitted into the first through-hole and the second through-hole by employing an ink-jetting method for patterning source electrodes and drain electrodes.

(10) The method of item 8, wherein the second insulating layer is made of a photosensitive material.

(11) The method of item 8, wherein the second insulating layer is a coating film formed by applying a solvent, which includes a water as a main ingredient.

(12) A method for fabricating an organic thin-film transistor on a substrate, comprising the steps of: forming a first wiring electrode on the substrate; forming a second wiring electrode on the substrate; forming an organic semiconductor layer on the substrate so as to cover both the first wiring electrode and the second wiring electrode; boring a first through-hole through the organic semiconductor layer in such a manner that a part of the first wiring electrode is exposed in the first through-hole; boring a second through-hole through the organic semiconductor layer in such a manner that a part of the second wiring electrode is exposed in the second through-hole; embedding a source electrode into the first through-hole so that the source electrode is electronically coupled to the first wiring electrode; embedding a drain electrode into the second through-hole so that the drain electrode is electronically coupled to the second wiring electrode; forming a gate insulating layer on the organic semiconductor layer so as to cover the organic semiconductor layer, the source electrode embedded in the first through-hole and the drain electrode embedded in the second through-hole; and forming a gate electrode on the gate insulating layer.

(13) The method of item 12, wherein, in the embedding steps for both the source electrode and the drain electrode, ink particles, of a solution or a dispersion liquid containing an electrode material, are emitted into the first through-hole and the second through-hole by employing an ink-jetting method for patterning source electrodes and drain electrodes.

(14) A method for fabricating an organic thin-film transistor on a substrate, comprising the steps of: forming a first wiring electrode on the substrate; forming a second wiring electrode on the substrate; forming an insulating layer on the substrate so as to cover the first wiring electrode and the second wiring electrode; forming an organic semiconductor layer on the insulating layer; boring a first through-hole through the insulating layer in such a manner that a part of the first wiring electrode is exposed in the first through-hole; boring a second through-hole through the insulating layer in such a manner that a part of the second wiring electrode is exposed in the second through-hole; embedding a source electrode into the first through-hole so that the source electrode is electronically coupled to the first wiring electrode; embedding a drain electrode into the second through-hole so that the drain electrode is electronically coupled to the second wiring electrode; forming a gate insulating layer on the organic semiconductor layer so as to cover the organic semiconductor layer, the source electrode embedded in the first through-hole and the drain electrode embedded in the second through-hole; and forming a gate electrode on the gate insulating layer.

(15) The method of item 14, wherein, in the boring steps for the first through-hole and the second through-hole, the first through-hole and the second through-hole are bored through both the insulating layer and the organic semiconductor layer.

(16) The method of item 14, wherein, in the embedding steps for both the source electrode and the drain electrode, ink particles, of a solution or a dispersion liquid containing an electrode material, are emitted into the first through-hole and the second through-hole by employing an ink-jetting method for patterning source electrodes and drain electrodes.

Further, to overcome the abovementioned problems, other organic thin-film transistors and methods for manufacturing them, embodied in the present invention, will be described as follow:

(17) An organic thin-film transistor characterized in that the organic thin-film transistor is formed by a through hole portion touching an organic semiconductor channel, and a source electrode and a drain electrode are formed to be at least an insulation layer.

(18) An organic thin-film transistor characterized in that the organic thin-film transistor is composed of a support and of layers, through holes and electrodes which are arranged on the support, such as a gate insulation layer, an organic semiconductor layer and a second insulation layer which are provided on the gate electrode, two through holes passing through the second insulation layer and a source electrode and a drain electrode which are embedded respectively in the through holes and are cemented to the organic semiconductor layer.

(19) An organic thin-film transistor characterized in that the organic thin-film transistor is composed of a support and of layers, through holes and electrodes which are arranged on the support, such as a first and second electrodes, an organic semiconductor layer provided on the aforesaid two electrodes, two through holes passing through the organic semiconductor layer and touching respectively the first and second electrodes, a source electrode and a drain electrode both embedded in the through holes and are cemented respectively to the organic semiconductor layer, the first electrode and the second electrode, a gate insulation layer formed on the structure, and a gate electrode formed on the gate insulation layer.

(20) An organic thin-film transistor characterized in that the organic thin-film transistor is composed of a support and of electrodes, layers and through holes which are arranged on the support, such as a first and second electrodes, an insulation layer provided on the aforesaid two electrodes, an organic semiconductor layer, two through holes passing through at least the insulation layer and touching respectively the first and second electrodes, a source electrode and a drain electrode both embedded in the through holes and are cemented respectively to the organic semiconductor layer, the first electrode and the second electrode, a gate insulation layer formed on the structure, and a gate electrode formed on the gate insulation layer.

(21) An organic thin-film transistor characterized in that the organic thin-film transistor is composed of a support and of electrodes, layers and through holes which are arranged on the support, such as a first and second electrodes, an insulation layer provided on the aforesaid two electrodes, an organic semiconductor layer, two through holes passing through at least the insulation layer and the organic semiconductor layer and touching respectively the first and second electrodes, a source electrode and a drain electrode both embedded in the through holes and are cemented respectively to the organic semiconductor layer, the first electrode and the second electrode, a gate insulation layer formed on the structure, and a gate electrode formed on the gate insulation layer.

(22) A manufacturing method, for an organic thin-film transistor, characterized in that a gate electrode is provided on a support on which a gate insulation layer, an organic semiconductor layer and a second insulation layer are formed successively, then, two through holes passing through the second insulation layer and touching the organic semiconductor layer are formed, and a source electrode and a drain electrode are embedded in the through holes so that these electrodes may be cemented to the organic semiconductor layer.

(23) A manufacturing method, for an organic thin-film transistor, characterized in that a first electrode and a second electrode are provided on a support, an organic semiconductor layer is formed on the electrode, two through holes that pass through the organic semiconductor layer and touch respectively the first electrode and the second electrode are formed, then, a source electrode and a drain electrode are embedded in the through holes in a way that these electrodes are cemented respectively to the organic semiconductor layer, the first electrode and the second electrode, then, gate insulation layers are formed respectively on the source electrode and the drain electrode, and a gate electrode is further provided on the gate insulation layer.

(24) A manufacturing method, for an organic thin-film transistor, characterized in that a first electrode and a second electrode are provided on a support, an insulation layer and an organic semiconductor layer are formed on the aforesaid electrodes in succession, two through holes that pass through at least the insulation layer and touch respectively the first electrode and the second electrode are formed, a source electrode and a drain electrode are embedded in the through holes in a way that these electrodes are cemented to the organic semiconductor layer, the first electrode and the second electrode, an organic semiconductor layer and a gate insulation layer are formed in succession respectively on the source electrode and the drain electrode, and a gate electrode is provided on the gate insulation layer.

(25) A manufacturing method, for an organic thin-film transistor, characterized in that a first electrode and a second electrode are provided on a support, an insulation layer and an organic semiconductor layer are formed on the aforesaid electrodes in succession, two through holes that pass through at least the insulation layer and the organic semiconductor layer and touch respectively the first electrode and the second electrode, then, a source electrode and a drain electrode are embedded in the through holes in a way that the electrodes are cemented respectively to the organic semiconductor layer, the first electrode and the second electrode.

BRIEF DESCRIPTION OF THE DRAWINGS

Other objects and advantages of the present invention will become apparent upon reading the following detailed description and upon reference to the drawings in which.

DETAILED DESCRIPTION OF THE PREFERRED EMBODIMENT

An organic thin-film transistor employing an organic semiconductor material of the invention as an active semiconductor layer and a manufacturing method of the organic thin-film transistor will be explained as follows, referring to FIGS. 1(a)–1(f), FIGS. 2(a)–2(b) and FIGS. 3(a)–3(f).

FIGS. 1(a)–1(f) show exemplified structures, each of which corresponding to each of manufacturing steps in a manufacturing process of a bottom gate type organic thin-film transistor.

Figure 1:
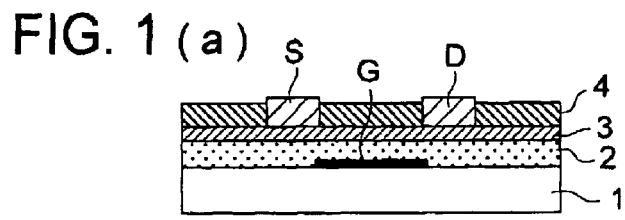
FIG. 1(*a*), FIG. 1(*b*), FIG. 1(*c*), FIG. 1(*d*), FIG. 1(*e*) and FIG. 1(*f*), show exemplified structures, each of which corresponding to each of manufacturing steps in a manufacturing process of a bottom gate type organic thin-film transistor.
Figure 1:
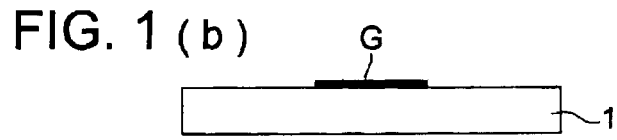
Figure 1:
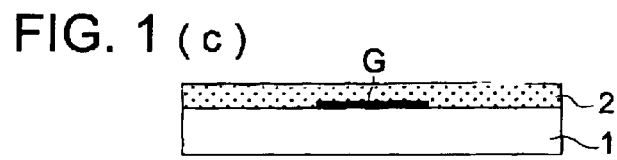
Figure 1:
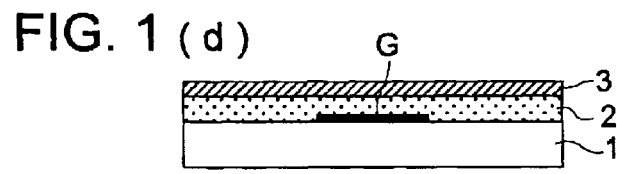
Figure 1:
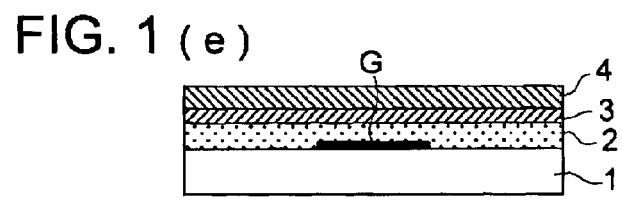
Figure 1:
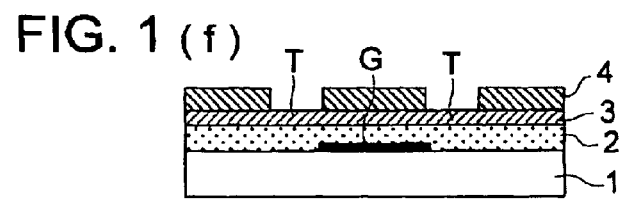

FIG. 1(a) shows an example of the structure of an organic thin-film transistor to be manufactured. Namely, gate electrode G is provided on support 1, and thereon, there are provided gate insulation layer 2, organic semiconductor layer 3, source electrode S and drain electrode D both provided to be in contact with an organic semiconductor layer, and second insulation layer 4 that is a protective layer and stabilizes an interface barrier wall between the source electrode and the organic semiconductor layer and between the drain electrode and the organic semiconductor layer.

FIG. 1(b) shows a situation wherein gate electrode G is provided on a support. Support 1 may also be composed of glass as described later, or of a sheet that is of flexible resin such as, for example, polyethylene terephthalate (PET).

A gate electrode is made of a conductive material such as platinum, gold, silver and nickel, which will be described later, and the electrode is obtained in a method wherein a conductive thin-film is formed by using a method of vacuum evaporation or spattering with the foregoing as a material, and then, patterning is conducted on the conductive thin-film thus formed in a known method of photolithography or a lift-off method. Further, a conductive fine-grain dispersion liquid may be used in a printing method or an ink-jet process to print for patterning.

A dielectric layer that serves as a gate insulation layer is coated after the gate electrode pattern is formed. FIG. 1(c) shows the state wherein gate insulation layer 2 is formed on the support on which the gate electrode is provided.

An inorganic oxide film having high specific dielectric constant, especially, a film of silicon oxide, silicon nitride, or of aluminum oxide is coated on the aforesaid gate electrode pattern for forming the gate insulation layer. As a method to form the inorganic oxide film, there are given a dry process that is the so-called gas phase sedimentation method such as a vacuum evaporation method, a CVD method, a sputtering method or an atmospheric pressure plasma method, a method by means of coating such as a spin coat method using the so-called sol-gel method, a blade coat method, a dip coat method or a die coat method, and a wet process such as a patterning method by means of printing or ink-jet. A method which is preferable in particular is one by means of coating employing the atmospheric pressure plasma method and the sol-gel method. A preferable film thickness of the insulation layer is in a range of 100 nm-1 µm.

As an insulation film used for the insulation layer, it is also possible to use a film of polyimide, polyamide or of an organic compound such as light-hardenable resin. In the case of a film of an organic compound, it is preferable to form the film through a wet process such as coating. An inorganic oxide film and n organic oxide film can be laminated to be used in combination.

Then, organic semiconductor layer 3 is coated on gate insulation layer 2 that is formed as shown in FIG. 1(d).

As an organic semiconductor, there is used π conjugated material, and organic semiconductor thin-films are formed by the gas phase sedimentation method such as a vacuum evaporation method, a CVD method or a sputtering method, a plasma polymerization method, an electrolytic polymerization method, a chemical polymerization method, a coating method such as a spray coat method or a spin coat method and an LB method. Among the aforesaid methods, however, the coating method that can form a thin-film in a simple and accurate way by using a solution of organic semiconductor is preferred from the viewpoint of productivity. A thickness of the thin-film formed by the organic semiconductor is not restricted in particular, but in many cases, characteristics of the obtained transistor are influenced by the film thickness of an active layer made of an organic semiconductor, and its thickness is 1 µm or less generally, and is 10–300 nm preferably in particular, although it varies depending on the organic semiconductor.

After the organic semiconductor thin-film is formed, there is further provided second insulation layer 4 as shown in FIG. 1(e).

Though the same material and process as in the first insulation layer can be used for the second insulation layer, it is preferable to make coating obtained through aqueous coating, for controlling damage on the organic semiconductor layer caused by the process. To be concrete, it is a coating containing hydrophilic polymer that is formed by a coating solution that employs a solvent containing 50% or more, preferably 80% or more of water. The hydrophilic polymer is polymer having solubility or dispersibility for water or an acidic aqueous solution, an alkaline aqueous solution and aqueous solutions of alcohols or of various surface active agents, and polyvinyl alcohol, homo-polymer composed of HEMA, acrylic acid or acrylic amide components, and copolymer, for example, are preferably used.

In the invention, light transmittance of the second insulation layer which is 10% or less is preferable, and 1% or less is more preferable. Thanks to this, deterioration of characteristics of the organic semiconductor layer caused by light can be restrained.

The transmittance mentioned in the present specification means an average transmittance in an wavelength area wherein a light-generating carrier can be generated on the organic semiconductor layer. In general, it is preferable to have capacity to shield for light with a wavelength of 350–750 nm.

For lowering the light transmittance of the layer, it is possible to use a method to make the layer to contain coloring materials such as pigments and dyes, or to contain UV absorbers.

Next process is one to form a through hole that is for forming a source electrode and a drain electrode. FIG. 1(f) shows the state wherein through hole T that passes through the second insulation layer 4 and arrives at organic semiconductor layer 3 is formed.

A method to form a through hole includes a method wherein a soluble etching solution such as a solution of organic solvent, an acid or alkali is jetted out by an ink-jet device for solution and washing, an ordinary photolithography, for example, a method to solve and wash the exposed portion after a resist pattern is formed, a method to conduct dry etching such as plasma etching after resist forming, and a method to conduct abrasion by means of excimer laser. Further, a light-sensitive resin layer that is described later may also be used for the second insulation layer. In particular, a method to use a laser-sensitive material is preferable because through holes can be formed efficiently and continuously while a support is conveyed, when a flexible support roll is used and the gate insulation layer and an organic semiconductor layer are laminated on the support.

As a material for a light-sensitive resin layer, a well-known positive working or negative working material can be used, but a laser sensitive material capable of carrying out laser exposure is preferably used. As such a material for a light-sensitive resin, there are (1) a dye sensitized photo-polymerizable light-sensitive material disclosed in Japanese Patent O.P.I. Publication No. 11-271969, (2) an infrared laser-sensitive negative working material disclosed in Japanese Patent O.P.I. Publication No. 9-179292, and (3) an infrared laser-sensitive positive working material in Japanese Patent O.P.I. Publication No. 9-171254. The material of item (2) or (3) above is preferred in that its use is not limited to use in the dark.

In photolithography, a metal particle dispersion or an electrically conductive polymer for materials of the source and drain electrodes is subjected to patterning, and optionally heat fused, whereby the source and drain electrodes can be easily and accurately formed. Further, photolithography can easily form various shapes, which makes it possible to easily produce an organic thin-film transistor.

Solvents for preparing a coating liquid of the light-sensitive resin layer include propylene glycol monomethyl ether, propylene glycol monoethyl ether, methyl cellosolve, methyl cellosolve acetate, ethyl cellosolve, ethyl cellosolve acetate, dimethylformamide, dimethylsulfoxide, dioxane, acetoe, cyclohexanone, trichloroethylene, and methyl ethyl ketone. These solvents may be used singly or as a mixture of two or more kinds thereof.

As a method for forming a light-sensitive resin layer, there is a coating method such as a spray coating method, a spin coating method, a blade coating method, a dip coating method, a casting method, a roll coating method, or a die coating method.

After the light-sensitive resin layer has been formed, the layer is subjected to patterning exposure. As a light source for the to patterning exposure, there are an argon laser, a semi-conductive laser, a He-Ne laser, a YAG laser, and a carbon dioxide gas laser, and a semi-conductive laser, which has an emission wavelength at the infrared wavelength regions, is preferred. The output power of the laser is suitably not less than 50 mW, and preferably not less than 100 mW.

The exposed light-sensitive resin layer is developed with a developer. The developer for developing the light-sensitive resin suitably an aqueous alkali developing solution. The aqueous alkali developing solution is an aqueous solution in which an alkali compound is dissolved in water. Examples of the alkali compound include an alkali metal salt such as sodium hydroxide, potassium hydroxide, sodium carbonate, potassium carbonate, sodium metasilicate, potassium metasilicate, sodium secondary phosphate, or sodium tertiary phosphate, and ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,3-diazabicyclo-[5,4,0]-7-undecane or 1,5-diazabecyclo-[4,3,0]-5-nonane. The concentration of the alkali compound in the developer in the invention is ordinarily from 1 to 10% by weight, and preferably from 2 to 5% by weight.

The developing solution may optionally contain an anionic surfactant, an amphoteric surfactant or an organic solvent such as alcohol. Examples of the organic solvent include propylene glycol, ethylene glycol monophenyl ether, benzyl alcohol and n-propylalcohol.

In the invention, an ablation layer may be used as the light-sensitive resin layer. The ablation layer used in the invention contains an energy absorption agent, a binder resin, and optionally various additives.

As the energy absorption agent, various inorganic or organic materials can be used which absorb energy light. When an infrared laser is used as a laser source, pigment, dyes, metal, metal oxides, metal nitride, metal carbide, metal boride, graphite, carbon black, titanium black, or ferromagnetic metal powder such as magnetic metal powder containing powder of Al, Fe, Ni, or Co as a main component, which absorb infrared rays, can be used as the energy absorption agent. Of these, carbon black, a dye such as a cyanine dye or Fe containing ferromagnetic metal powder is preferred. The content of the energy absorption agent in the ablation layer is from 30 to 90% by weight, and preferably from 40 to 80% by weight.

The binder resin is used without any limitation, as long as it can sufficiently carry the colorant particles described above. Examples of the binder resin include a polyurethane resin, a polyester resin, a vinyl chloride resin, a polyvinyl acetal resin, a cellulose resin, an acryl resin, a phenoxy resin, a polycarbonate resin, a polyamide resin, a phenol resin, and an epoxy resin. The content of the binder resin in the ablation layer is from 5 to 70% by weight, and preferably from 20 to 60% by weight.

The ablation layer herein referred to implies a layer ablated by exposure to a high density energy light, and ablation herein referred to implies phenomenon that an ablation layer completely scatters or is partly broken to scatter due to its physical or chemical change or that physical or chemical change occurs only at the vicinity of the interface between the ablation layer and its adjacent layer.

The high density energy light is used without any limitation, as long as it is an active light which causes ablation. An exposure method may be a method which carries out flash exposure through a photo mask employing a xenon lamp, a halogen lamp, or a mercury lamp, or a method which carries out scanning exposure employing laser rays converged. An infrared laser, especially a semiconductor laser, which has a output power of from 20 to 200 mW per one beam, most preferably used. Energy density is preferably from 50 to 500 mJ/cm$^2$, and more preferably from 100 to 300 mJ/cm$^2$.

The light-sensitive resin layer preferably contains materials such that the layer is formed employing an aqueous coating liquid. Examples of such materials, which are used as photo-resist materials, include materials disclosed in Japanese Patent O.P.I. Publication Nos. 7-104470, 7-319160, and 8-328249.

Figure 2:
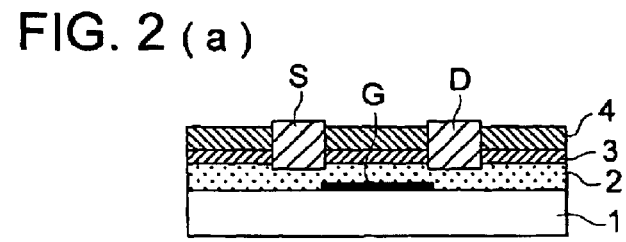
FIG. 2(*a*) and FIG. 2(*b*) are diagrams showing an example of the structure of other bottom gate type organic thin-film transistors.
Figure 2:
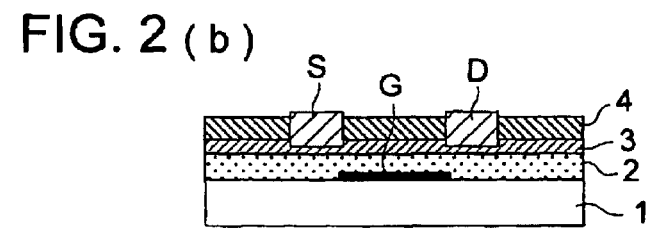

The through holes T may be formed so as to contact the organic semiconductor layer 3 through the second insulation layer 4. As is shown in FIG. 2(a), the through holes do not enter the organic semi-conductor layer 4, and preferably contact the source electrode and the drain electrode at the surface of the organic semi-conductor layer 3, in that contact resistance can be reduced.

FIG. 1(a) shows constitution of an organic thin-film transistor in which the through holes are charged with an electrode material to form a source electrode S and a drain electrode D.

Materials used in the electrode are preferably those which provide a low electric resistance at the electrode surface contacting the organic semi-conductor layer 3, which are detailed later. The electrodes can be formed employing a solution, dispersion liquid or dispersion paste of conductive polymer, or employing a dispersion liquid or paste of metal particles (such as gold, silver, copper or platinum particles with a size of several nanometers to several tens of microns), by means of a patterning method such as an ink jet method employing a continuous jetting method, an on demand ink jet method employing a piezo element, a screen printing method or a lithographic printing method.

The electrodes are formed employing known conductive polymers or metals without any limitations. Further, the electrodes may be formed according to known photolithography or a lift-off method.

Each of FIGS. 2(a) and 2(b) shows an example of the structure of the organic thin-film transistor of the same bottom gate type wherein a depth of the hole is changed from the other when the through hole 5 is formed. Since a source electrode and a drain electrode have only to be in contact with an organic semiconductor, FIG. 2(a) shows that formation of the through hole was stopped when the hole penetrated the second insulation layer 4 and arrived at the organic semiconductor layer 3, while, FIG. 2(b) shows that formation of the through hole was stopped on the half way in the organic semiconductor layer 3. For changing the depth of the through hole, energy of excimer laser and time of applying laser are adjusted.

By forming the through hole T that extends from the second insulation layer to the gate insulation layer in the aforesaid way after formation of the gate electrode G, preferably after the gate insulating layer 2, the organic semiconductor layer 3 and the second insulation layer 4 are formed in succession in the simple and easy coating method, it is possible to conduct highly accurate patterning.

Next, FIG. 3(a), FIG. 3(b), FIG. 3(c), FIG. 3(d), FIG. 3(e) and FIG. 3(f), show exemplified structures, each of which corresponding to each of manufacturing steps in a manufacturing process of a top gate type organic thin-film transistor.

Figure 3A:
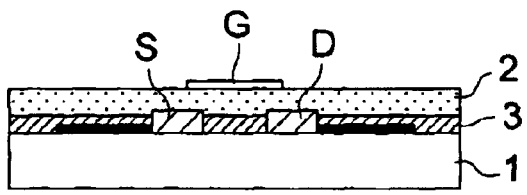
FIG. 3(*a*), FIG. 3(*b*), FIG. 3(*c*), FIG. 3(*d*), FIG. 3(*e*) and FIG. 3(*f*), show exemplified structures, each of which corresponding to each of manufacturing steps in a manufacturing process of a top gate type organic thin-film transistor.

FIG. 3(a) shows the structure of the thin-film transistor to be fabricated, and each of FIG. 3(b), FIG. 3(c), FIG. 3(d), FIG. 3(e) and FIG. 3(f) shows each of manufacturing steps in its manufacturing process.

Figure 3B:

FIG. 3(b) shows the state of the first process wherein first electrode S' and second electrode D' representing respectively a source electrode and a drain electrode are formed on the support.

In the same way as in the gate electrode, an electrode pattern composed of conductive materials such as platinum, gold, silver and nickel is formed in a way for patterning by means of the known photolithography or a lift-off method, by using a method of vacuum evaporation or sputtering.

Figure 3C:

Then, as shown in FIG. 3(c), organic semiconductor layer 3 is formed uniformly on each electrode pattern of the first electrode S' and the second electrode D' in a coating method, for example, by using a solution of organic semiconductor selected from π conjugated material such as polythiophene. The film thickness to be formed is preferably 10–300 nm.

After the organic semiconductor layer 3 is formed, through holes T are formed on the organic semiconductor layer so that the through holes may touch respectively the first electrode S' and the second electrode D'. This is shown in FIG. 3(d).

Figure 3D:
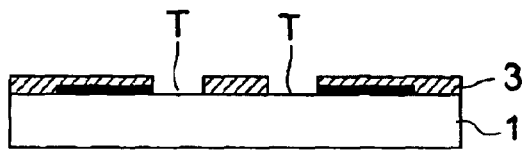

The through holes T may be formed to arrive at the support (as shown in FIG. 3(d)), or the bottom of the through hole may be in the organic semiconductor layer without arriving at the support, provided that a depth of the through hole is enough to touch the first electrode S' or the second electrode D'.

Figure 3E:
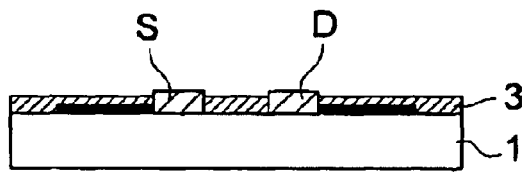

Source electrode S and drain electrode D are constituted when conductive materials which are conductive with the first electrode S' and the second electrode D' such as a dispersion liquid of metallic fine-grains (for example, grains in a size of a few μm to several tens μm of gold, silver, copper or platinum) or paste are embedded in the through hole T after the through hole is formed. This is shown in FIG. 3(e). As a conductive material, it is possible to use ink containing known conductive polymer such as polythiophene whose conductivity has been improved by doping, and it is preferable to form by means of a printing method.

Since the through hole is formed in advance, the method becomes one having excellent patterning accuracy. The electrodes are conductive respectively with the first and second electrodes (S' and D') formed on the support first to constitute integrally the source electrode S and drain electrode D.

Figure 3F:
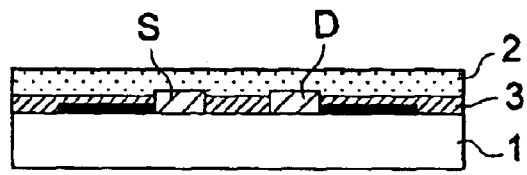

Then, on the source electrode S and the drain electrode D thus formed, there is formed gate insulation layer 2 (FIG. 3(f)) by the method of vacuum evaporation of inorganic oxide film having high specific dielectric constant, especially, of a dielectric substance film such as silicon oxide, or by the method of spin coat by means of a sol-gel method. A film thickness of the insulation layer is made, for example, to be 200 nm. Further, in addition to the sol-gel method, an atmospheric pressure plasma method is also preferable for forming an insulation layer. Or, as an insulation layer, a film of organic compound resin such as polyimide may be used.

By conducting patterning formation of gate electrode G on the gate insulation layer 2 after the gate insulation layer is formed, organic thin-film transistor (TFT) as shown in FIG. 3(a) is constituted.

Figure 4:
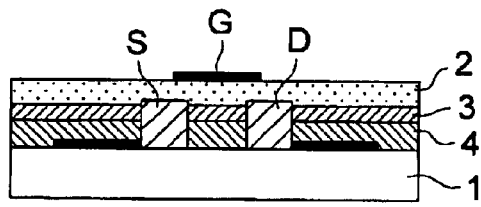
FIG. 4(*a*), FIG. 4(*b*), FIG. 4(*c*), FIG. 4(*d*), FIG. 4(*e*) and FIG. 4(*f*), show exemplified structures, each of which corresponding to each of manufacturing steps in a manufacturing process of another top gate type organic thin-film transistor.
Figure 4:
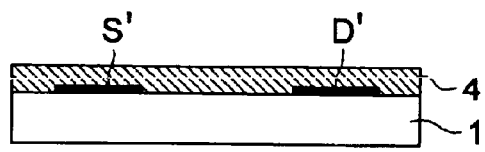
Figure 4:
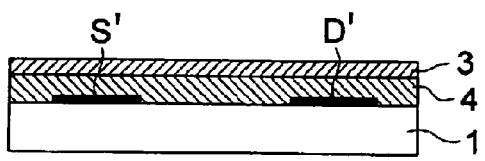
Figure 4:
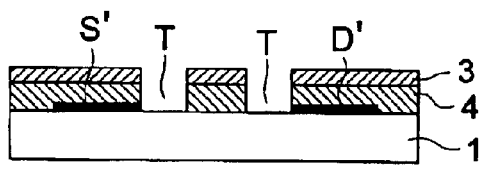
Figure 4:
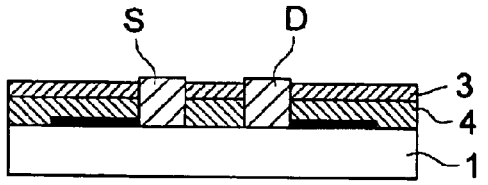
Figure 4:
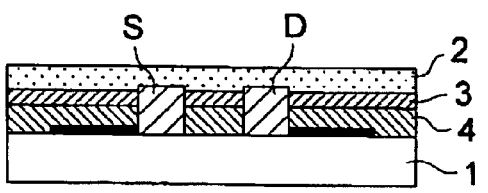

Further, FIG. 4(a), FIG. 4(b), FIG. 4(c), FIG. 4(d), FIG. 4(e) and FIG. 4(f), show exemplified structures, each of which corresponding to each of manufacturing steps in a manufacturing process of another top gate type organic thin-film transistor. FIG. 4(a) shows the structure of the organic thin-film transistor to be fabricated.

The process for forming an electrode on the support is the same as one shown in FIG. 3(b). Then, as shown in FIG. 4(b), first insulation layer 4 is formed on the pattern of the first electrode S' and the second electrode D'. An inorganic oxide film having high specific dielectric constant, especially, a dielectric substance film such as silicon oxide is formed as an insulation layer. AS an insulation layer, for example, an organic compound resin film is formed, then, the processing such as rubbing is conducted on the organic compound resin film so that it has a function as an orientation film of an organic semiconductor layer formed on the insulation layer, which is advantageous.

Further, after forming an organic semiconductor, ablation processing by means of the excimer laser is conducted, as shown in FIG. 4(d), to form through holes T which penetrate organic semiconductor layer 3 and insulation layer 4 to touch respectively the first electrode S' and the second electrode D' both formed in the first place. Though the ablation processing can be conducted either before or after forming the organic semiconductor layer, it is preferable to conduct it after forming the organic semiconductor.

After forming the through holes, conductive materials are embedded in respective through holes in the same way as in the foregoing to form source electrode S and drain electrode D which are cemented respectively to the first electrode S' and the second electrode D' (FIG. 4(e)). Then, organic semiconductor layer 3 is formed on the insulation layer to realize the structure shown in FIG. 4(c). On the organic semiconductor layer 3, there is provided gate insulation layer 2 (FIG. 4(f)) on which gate electrode G is further provided to constitute an organic thin-film transistor of a top gate type shown in FIG. 4(a).

Figure 5A:
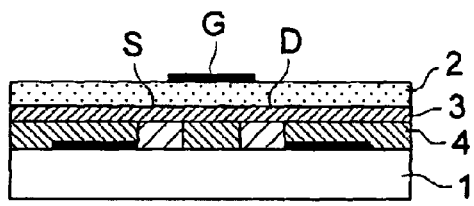
FIG. 5(a), FIG. 5(b) and FIG. 5(c) are diagrams showing examples of structures of other top gate type organic thin-film transistors.
Figure 5B:
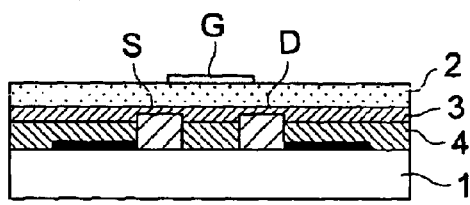
Figure 5C:
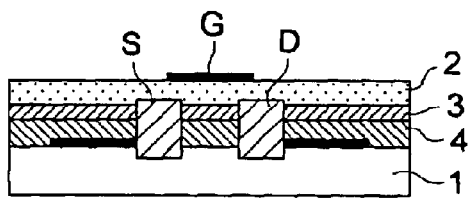

As an example of the structure, FIG. 5(a), FIG. 5(b) and FIG. 5(c) show some top gate type organic thin-film transistors, which are formed by changing a depth of through hole 5 and timing of the ablation processing.

Each of these top gate type organic thin-film transistors can be made to face a gate electrode through a gate insulation layer, in the form which is different from that of the source electrode and the drain electrode both formed on the support in the first place, thus, a form of an electrode can be finished in the course of forming a thin-film transistor, which is convenient.

In the invention, π-conjugated polymers are used as materials for organic semiconductors. Examples of the materials for organic semiconductors include polypyrroles such as polypyrrole, poly(N-substituted pyrrole), poly(3-substituted pyrrole), and poly(3,4-disubstituted pyrrole); polythiophenes such as polythiophene, poly(3-substituted thiophene), poly(3,4-disubstituted thiophene), and polybenzothiophene; polyisothianaphthenes such as polyisothianaphthene; polythienylenevinylenes such as polythienylenevinylene; poly(p-phenylenevinylenes) such as poly(p-phenylenevinylene); polyanilines such as polyaniline, poly(N-substituted aniline), poly(3-substituted aniline), and poly(2,3-substituted aniline); polyacetylnenes such as polyacetylene; polydiacetylens such as polydiacetylene; polyazulenes such as polyazulene; polypyrenes such as polypyrene; polycarbazoles such as polycarbazole and poly(N-substituted carbazole), polyselenophenes such as polyselenophene; polyfurans such as polyfuran and polybenzofuran; poly(p-phenylenes) such as poly(p-phenylene); polyindoles such as polyindole; polypyridazines such as polypyridazine; polyacenes such as naphthacene, pentacene, hexacene, heptacene, dibenzopentacene, tertabenzopentacene, pyrene, dibenzopyrene, chrysene, perylene, coronene, terylene, ovalene, quoterylene, and circumanthracene; derivatives (such as triphenodioxazine, triphenodithiazine, hexacene-6,15-quinone) in which some of carbon atoms of polyacenes are substituted with atoms such as N, S, and O or with a functional group such as a carbonyl group; polymers such as polyvinyl carbazoles, polyphenylene sulfide, and polyvinylene sulfide; and polycyclic condensation products described in Japanese Patent O.P.I. Publication No. 11-195790. Further, oligomers having repeating units in the same manner as in the above polymers, for example, thiophene hexamers including α-sexithiophene, α, ω-dihexyl-α-sexithiophene, α,ω-dihexyl-α-quiinquethiophene, and α,ω-bis(3-butoxypropyl)-α-sexithiophene, or styrylbenzene derivatives, can be suitably employed. Further, listed are metallophthalocyanines such as copper phthalocyanine, and fluorine-substituted copper phthalocyanines described in Japanese Patent O.P.I. Publication No. 11-251601; tetracarboxylic acid diimides of condensed ring compounds including naphthalene tetracarboxylic acid imides such as naphthalene 1,4,5,8-teracarboxylic acid diimide, N,N'-bis(4-trifluoromethylbenzyl)naphthalene 1,4,5,8-tretracarboxylic acid diimide, N,N'-bis(1H,1H-perfluoroctyl)naphthalene 1,4,5,8-tetracarboxylic acid diimide derivatives, N,N'-bis(1H,1H-perfluorobutyl)naphthalene 1,4,5,8-tetracarboxylic acid diimide derivatives, N,N'-dioctylnaphthalene 1,4,5,8-tetracarboxylic acid diimide derivatives, and naphthalene 2,3,6,7-tetracarboxylic acid diimides, and anthracene tetracarbocylic acid diimides such as anthracene 2,3,6,7-tetracarboxylic acid diimides; fullerenes such as $C_{60}$, $C_{70}$, $C_{76}$, $C_{78}$, and $C_{84}$; carbon nanotubes such as SWNT; and dyes such as merocyanines and hemicyanines.

Of these π conjugated compounds, preferably employed is at least one selected from the group consisting of oligomers which have thiophene, vinylene, thienylenevinylene, phenylenevinylene, p-phenylene, their substitution product or at least two kinds thereof as a repeating unit and have a repeating unit number n of from 4 to 10, polymers which have the same unit as above and a repeating unit number n of at least 20, condensed polycyclic aromatic compounds such as pentacene, fullerenes, condensed cyclic tetracarboxylic acid diimides of condensed ring compounds, and metallophthalocyanines.

Further, employed as other materials for organic semiconductors may be organic molecular complexes such as a tetrathiafulvalene (TTF)-tetracyanoquinodimethane (TCNQ) complex, a bisethylenetetrathiafulvalene (BEDTTTF)-perchloric acid complex, a BEDTTTF-iodine complex, and a TCNQ-iodine complex. Still further, employed may be σ conjugated polymers such as polysilane and polygermane, as well as organic-inorganic composite materials described in Japanese Patent O.P.I. Publication No. 2000-260999.

In the invention, the organic semiconductor layer may be subjected to a so-called doping treatment (referred to also as simply doping) by incorporating in the layer, materials working as an acceptor which accepts electrons, for example, acrylic acid, acetamide, materials having a functional group such as a dimethylamino group, a cyano group, a carboxyl group and a nitro group, benzoquinone derivatives, or tetracyanoethylene, tetracyanoquinodimethane or their derivatives, or materials working as a donor which donates electrons, for example, materials having a functional group such as an amino group, a triphenyl group, an alkyl group, a hydroxyl group, an alkoxy group, and a phenyl group; substituted amines such as phenylenediamine; anthracene, benzoanthracene, substituted benzoanthracenes, pyrene, substituted pyrene, carbazole and its derivatives, and tetrathiafulvalene and its derivatives.

The doping herein means that an electron accepting molecule (acceptor) or an electron donating molecule (donor) is incorporated in the organic semiconductor layer as a dopant. Accordingly, the layer, which has been subjected to doping, is one which comprises the condensed polycyclic aromatic compounds and the dopant. Employed as the dopant used in the present invention may be either acceptor or donor. Examples of the acceptor include halogens such as $Cl_2$, $Br_2$, $I_2$, ICl, $ICl_3$, IBr, and IF; Lewis acids such as $PF_5$, $AsF_5$, $SbF_5$, $BF_3$, $BCl_3$, $BBr_3$, and $SO_3$; protonic acids such as HF, HCl, $HNO_3$, $H_2SO_4$, $HClO_4$, $FSO_3H$, $ClSO_3H$, and $CF_3SO_3H$; organic acids such as acetic acid, formic acid, and amino acid; transition metal compounds such as $FeCl_3$, FeOCl, $TiCl_4$, $ZrCl_4$, $HfCl_4$, $NbF_5$, $NbF_5$, $NbCl_5$, $TaCl_5$, $MoCl_5$, $WF_5$, $WCl_5$, $UF_6$, $LnCl_3$ (Ln=lanthanoid such as La, Ce, Nd, and Pr, and Y), and electrolyte anions such as Cl$^-$, Br$^-$, I$^-$, ClO$^{4-}$, PF$^{6-}$, AsF$^{5-}$, SbF$^{6-}$, BF$^{4-}$, and a sulfonate anion. Examples of the donor include alkali metals such as Li, Na, K, Rb, and Cs; alkaline earth metals such as Ca, Sr, and Ba; rare earth metals such as Y, La, Ce, Pr, Nd, Sm, Eu, Gd, Tb, Dy, Ho, Er, and Yb; an ammonium ion; R$_4$P$^+$, R$_4$AS$^+$, and R$_3$S$^+$; and acetylcholine. Doping these dopants may be carried out employing either a method in which the dopants are incorporated into an organic semiconductor layer having been formed, or a method in which the dopants are incorporated into an organic semiconductor layer while the layer is formed. The former methods include a gas phase doping in which gaseous dopants are employed, a liquid phase doping in which doping is carried out while the layer is brought into contact with a dopant solution or a liquid dopant, and a solid phase doping in which diffusion doping is carried out while the layer is brought into contact with a solid dopant so that the dopant diffuse into the layer. In the liquid phase doping, it is possible to adjust the doping efficiency by means of electrolysis. In the latter method, a solution or a dispersion each containing an organic semiconductor material and a dopant may be coated and subsequently dried. For instance, when a vacuum deposition method is used, dopants may be incorporated in the layer by co-deposition of an organic semiconductor material and a dopant. Further, when the layer is formed employing a sputtering method, sputtering is carried out utilizing the two targets of an organic semiconductor material and a dopant, whereby the dopant can be incorporated in the layer. Still further, as other methods, it is possible to use any of chemical doping such as electrochemical doping or photoinitiation doping, or physical doping such as an ion injection method as shown in, for example, a publication "Kogyo Zairyo", Volume 34, No. 4, page 55 (1986).

The methods for forming the organic semiconductor layer include a vacuum deposition method, a molecular beam epitaxial growth method, an ion cluster beam method, a low energy ion beam method, an ion plating method, a CVD method, a sputtering method, a plasma polymerization method, an electrolytic polymerization method, a chemical polymerization method, a spray coating method, a spin coating method, a blade coating method, a dip coating method, a casting method, a roll coating method, an bar coating method, a die coating method, and an LB method. These methods may be used according to kinds of materials used. However, of these, a spin coating method, a blade coating method, a dip coating method, a roll coating method, a bar coating method, and a die coating method are preferred from the viewpoint of productive efficiency. Further, they can simply and accurately form the layer employing a solution of organic semiconductor materials. The thickness of the organic semiconductor layer is not specifically limited. The thickness of an active layer comprised of the organic semiconductor materials often has a great influence on properties of the resultant transistor. Accordingly, the thickness of the layer differs due to kinds of the organic semiconductor materials used, but it is ordinarily not more than 1 µm, preferably from 10 to 300 nm, and more preferably from 20 to 100 nm.

A support used in the organic thin-film transistor is comprised of glass or a flexible resin sheet. For example, it is possible to use a plastic film as the sheet. Examples of the plastic film include films comprised of, for example, polyethylene terephthalate (PET), polyethylene naphthalate (PEN), polyethersulfone (PES), polyetherimide, polyether ether ketone, polyphenylene sulfide, polyallylate, polyimide, polycarbonate (PC), cellulose triacetate (TAC), or cellulose acetate propionate (CAP). Use of the plastic film makes it possible to decrease weight, to enhance portability, and to enhance durability against impact due to its flexibility, as compared to glass.

In the invention, a transparent protective layer can be formed on a display element, and a functional layer, for example, an anti-reflection layer can be also formed on the element.

Materials for constituting the gate, source, and drain electrodes in the organic thin-film transistor are not particularly restricted as long as they are electrically conductive materials. Employed as the materials are platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium oxide-tin (ITO), fluorine-doped zinc oxide, zinc, carbon, graphite, glassy carbon, silver paste as well as carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixtures, magnesium/silver mixtures, magnesium/aluminum mixtures, magnesium/indium mixtures, aluminum/aluminum oxide mixtures, and lithium/aluminum mixtures. Of theses, specifically preferred are platinum, gold, silver, copper, aluminum, indium, and ITO.

Electrically conductive polymers known in the art are suitably employed, which include electrically conductive polyaniline, electrically conductive polypyrrole, electrically conductive polythiophene, and a complex of polyethylenedioxythiophene and polystyrene sulfonic acid, which increase electrical conductivity upon being doped.

Materials for the source and drain electrodes are preferably those which provide a low electric resistance at the electrode surface contacting the organic semi-conductor layer.

Methods for forming the electrode include a method in which a photolithographic method or a lift-off method, known in the art, is applied to an electrically conductive layer of the materials described above, which has been formed employing a vacuum deposition method or a sputtering method, and a method in which a resist layer is subjected to etching which has been prepared employing thermal transfer or ink jet printing onto a foil of metal such as aluminum or copper. Further, an electrically conductive polymer solution or dispersion, or a minute electrically conductive particle dispersion may be subjected directly to patterning, employing ink jet printing to obtain an electrode. An electrode may also be formed in such a manner that a coated layer is subjected to lithography or laser ablation. In addition, a method may also be employed in which ink comprising either an electrically conductive polymer or minute electrically conductive particles, or electrically conductive paste is subjected to patterning, employing any of the printing methods such as letter press, intaglio printing, lithography, or screen printing.

The most preferable method of these methods is a method in which the through holes are charged with a solution or dispersion of the electrode material employing an ink-jet method, and then subjected to patterning.

In order to reduce barrier to the organic semiconductor layer and reduce the contact resistance with the organic semiconductor layer, an electrically conductive polymer or noble metals such as gold or platinum are preferred as materials for the electrode. When noble metals are used, it is preferred that a dispersion of metal particles, described in Japanese Patent O.P.I. Publication Nos. 2000-239853, 2001-254185, and 11-80647, is jetted in an electrode pattern on the semiconductor layer according to an ink-jet method, dried, and subjected to heat treatment at 100 to 300° C., whereby the metal particles are heat-fused on the semiconductor layer to form an electrode.

Herein, the thin-film transistor is explained above. However, the same as described in the above applies to signal lines, scanning lines, electrode materials, and their formation methods in a TFT sheet.

Various insulation layers may be employed as the gate insulation layer in the organic thin-film transistor of the invention. The insulation layer is preferably a layer comprised of an inorganic compound with high dielectric constant. Examples of the inorganic compound include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Of these, silicon oxide, silicon nitride, aluminum oxide, tantalum oxide or titanium oxide is particularly preferred. Silicon nitride or aluminum nitride can be also suitably used.

The methods for forming the insulation layer include a dry process such as a vacuum deposition method, a molecular beam epitaxial growth method, an ion cluster beam method, a low energy ion beam method, an ion plating method, a CVD method, a sputtering method, or a plasma method, a wet process such as a spray coating method, a spin coating method, a blade coating method, a dip coating method, a casting method, a roll coating method, an bar coating method, or a die coating method, and a patterning method such as a printing method or an ink-jet method. These methods can be used due to kinds of materials used in the insulation layer. As the typical wet process can be used a method of coating a dispersion liquid and drying, the liquid being obtained by dispersing inorganic oxide particles in an organic solvent or water optionally in the presence of a dispersant such as a surfactant or a so-called sol gel method of coating a solution of an oxide precursor such as an alkoxide and drying. Among the above, the preferred are an atmospheric pressure plasma method and a sol gel method.

A method of forming an insulation layer according to the plasma layer formation method at atmospheric pressure will be explained below.

The plasma layer formation method at atmospheric pressure means a method wherein a reactive gas is plasma-excited by discharge conducted at atmospheric pressure or at approximately atmospheric pressure, whereby a thin-film is formed on a substrate. The method (hereinafter referred to also as an atmospheric pressure plasma method) is described in Japanese Patent O.P.I. Publication Nos. 11-133205, 2000-185362, 11-61406, 2000-147209 and 2000-121804. This method can form a thin film having high performance at high productivity.

Examples of the organic compound used in the insulation layer include polyimide, polyamide, polyester, polyacrylate, a photo-curable resin such as a photo-radical polymerizable or photo-cation polymerizable resin, a copolymer containing an acrylonitrile unit, polyvinyl phenol, polyvinyl alcohol, novolak resin, and cyanoethylpullulan. As a method of forming an organic compound film, the wet process described above is preferably used.

An inorganic oxide layer and an organic oxide layer can be used in combination and superposed. The thickness of the insulation layer is generally 50 nm to 3 $\mu$m, and preferably 100 nm to 1 $\mu$m.

As a coating method of each layer, known coating methods can be used which include dipping coating, spin coating, knife coating, bar coating, blade coating, squeeze roller coating, reverse coating, gravure roller coating, curtain coating, spray coating, and die coating. A coating method capable of conducting continuous coating or thin layer coating is preferably used.

EXAMPLE

The invention will be explained specifically as follows, referring to Examples to which, however, the invention is not limited.

Example 1

Figure 6A:
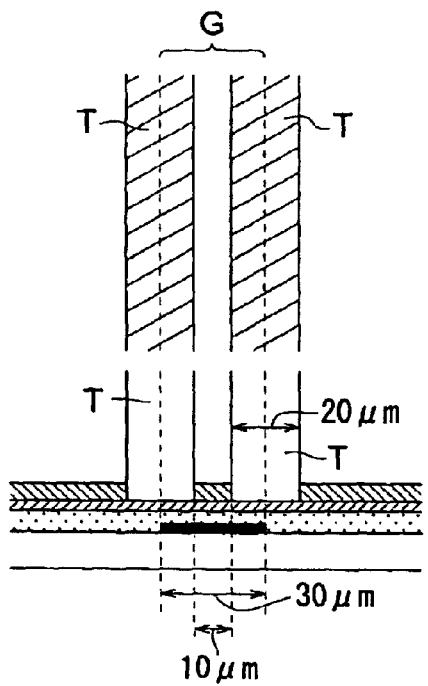
FIG. 6(a) and FIG. 6(b) are diagrams showing the structure of an organic thin-film transistor and a part of the process of manufacturing.

FIG. 6(a) and FIG. 5(b) show the structure of the organic thin-film transistor fabricated and a part of the manufacturing process.

By using a polyethylene terephthalate (PET) film having a thickness of about 100 $\mu$m on which aluminum has been evaporated to be a 200 nm-thick layer, gate electrode G having a width of 30 $\mu$m was formed by the known photolithography.

On the gate electrode G, there was formed a silicon oxide film serving as 200 nm-thick gate insulation layer 2, by the atmospheric pressure plasma method. Incidentally, for the silicon oxide film, the apparatus described in TOKKAI No. 2000-80182 was used, and a mixture gas including argon (98.2% by volume), tetramethoxysilane (0.3% by volume) and hydrogen gas (1.5% by volume) was used as a reaction gas.

After that, a chloroform solution of regioregular isomer (made by Aldrich Co.) of well-defined poly (3-hexylthiophene) was coated on the silicon oxide film, then, chloroform was dried sufficiently at 150° C., and 30 nm-thick organic semiconductor layer 3 was formed. In addition, an ethylene glycol monomethyl ether solution of novolak resin was coated, then, it was processed at 120° C. for 10 minutes, and second insulation layer 4 having a thickness of 5 $\mu$m was formed.

Then, the organic semiconductor layer 3 was ablated by KrF excimer laser to be processed as shown in FIG. 6(a). A portion shown with slanting lines represents a laser-processed surface, and through holes T were formed on the processed surface. Incidentally, a width of the through hole processed by the laser was made to be 20 $\mu$m, and a distance between two through holes was made to be 10 $\mu$m. In this case, laser power was adjusted to the condition in which the second insulation layer 4 is penetrated and the surface layer of the organic semiconductor layer is exposed.

Figure 6B:
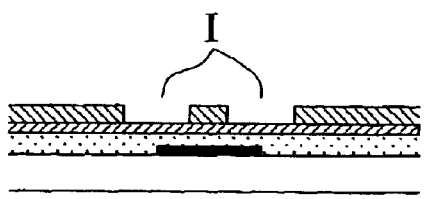

Then, conductive polymer that is available on the market (Baytron P made by Bayer Co.; complex of poly-(ethylenedioxythiophene) and sulfonated polystyrene, aqueous dispersion liquid 1% by weight) was jetted on the surface processed by excimer laser, by an ink-jet device of a piezoelectric system. FIG. 6(b) shows the state where an ink droplet has been jetted in the through hole. I represents a jetted ink droplet of conductive polymer. (A jetted aqueous dispersion liquid of conductive polymer does not spread on the water-repellant second insulation layer surface. Namely, the source electrode and the drain electrode are not short-circuited, and are formed stably). Further, by drying at 120°

C. for 10 minutes, the source electrode and the drain electrode were formed to be an organic thin-film transistor.

This organic thin-film transistor showed excellent operation characteristics as FET of a p channel enhancement type. When carrier mobility in the saturated area was measured, it was 0.08 cm$^2$/Vs.

Example 2

The organic thin-film transistor was formed, conforming to the structure shown in FIGS. 3(a)–3(f). There was prepared a polyimide film having a thickness of about 100 μm on which aluminum was evaporated to be a 200 nm-thick layer. The aluminum layer was subjected to patterning conducted by the known photolithography, and first electrode S' and second electrode D' were formed to be away from each other by about 30 μm. Then, a chloroform solution of regioregular isomer (made by Aldrich Co.) of well-defined poly (3-hexylthiophene) was coated on the first electrode S' and the second electrode D', then, chloroform was dried sufficiently at 150° C., and 30 nm-thick organic semiconductor layer 3 was formed. Next, the organic semiconductor layer 3, a part of the first electrode S' and a part of the second electrode D' were subjected to ablation by KrF excimer laser, and two through holes were formed as shown in FIG. 3(d). An image for patterning of the electrodes and the through holes is the same as that shown in FIG. 6(a) and FIG. 6(b).

Next, a gold ultrafine-grain dispersion liquid (aqueous dispersion liquid) shown in TOKKAI No. 2000-239853 was jetted by an ink-jet device on the through holes and dried at 250° C. for 10 minutes, and source electrode S and drain electrode D each being composed of a gold thin-film were formed. On the source electrode S and drain electrode D, there was formed a 200 nm-thick silicon oxide film by an atmospheric pressure plasma method as gate insulation layer 2, in the same way as in Example 1, thereby, gate electrode G having a width of 30 μm was formed by printing silver conductive paste available on the market. Thus, an organic thin-film transistor of a top gate type having the structure shown in FIGS. 3(a)–3(f) was obtained.

This organic thin-film transistor showed excellent operation characteristics of FET of a p channel enhancement type. When carrier mobility in the saturated area was measured, it was 0.03 cm$^2$/Vs.

Example 3

The organic thin-film transistor was formed, conforming to the structure shown in FIGS. 4(a)–4(f). A copper ultrafine-grain dispersion liquid (aqueous dispersion liquid) shown in TOKKAI No. 2000-239853 was jetted by a ink-jet device on the surface of a PES film having a thickness of about 100 μm, and first electrode S' and second electrode D' were formed to be away from each other by about 30 μm. On the first electrode S' and second electrode D', there was formed 200 nm-thick silicon oxide film by an atmospheric pressure plasma method as insulation layer 4, in the same way as in Example 1. Next, insulation layer 4, a part of the first electrode S' and a part of the second electrode D' were subjected to ablation by the KrF excimer laser, and two through holes were formed as shown in FIG. 4(d).

Next, a gold ultrafine-grain dispersion liquid (aqueous dispersion liquid) was jetted by an ink-jet device on the through holes T in the same way as in Example 2, and dried at 250° C. for 10 minutes, and source electrode S and drain electrode D were formed. In this case, conductivity is generated by heat treatment also on the first electrode S' and the second electrode D'. Then, a chloroform solution of regioregular isomer (made by Aldrich Co.) of well-defined poly (3-hexylthiophene) was coated on the insulation layer 4, then, chloroform was dried sufficiently at 150° C., and 30 nm-thick organic semiconductor layer 3 was formed. Further, a 300 nm-thick alumina film was formed by an atmospheric pressure plasma method as gate insulation layer 2, and a gate electrode having a width of 30 μm was formed by printing silver conductive paste available on the market. Thus, an organic thin-film transistor of a top gate type having the structure shown in FIGS. 4(a)–4(f) was obtained.

This organic thin-film transistor showed excellent operation characteristics of FET of a p channel enhancement type. When carrier mobility in the saturated area was measured, it was 0.05 cm$^2$/Vs.

Example 4

A 2000 Å-thick thermal oxidation film was formed on an n type Si wafer having the specific resistance of 0.01 Ω·cm, then, pentacene refined through sublimation was evaporated, and thereby, a 50 nm-thick organic semiconductor layer was formed. Following composition liquid A was coated on the organic semiconductor layer by the use of an applicator, to be dried, and a light-sensitive insulation layer (thickness 2 μm, light transmittance 0.5%) was formed.

(Composition liquid A)

Some 20 parts by weight of carbon black (made by Mitsubishi Kasei Co., Product name "MA100") as a black pigment, 5 parts by weight of polyoxy ethylene alkylphenyl ether (made by Daiichi Kogyo Pharmaceutical Co., Product name "Neugen EA177") with HLB value 17 as surface active agents and 75 parts by weight of water were mixed and dispersed by a sandmill. Then, 100 parts by weight of this dispersion liquid, 50 parts by weight of aqueous solution of 10% by weight of poly 2-hydroxy ethyl methacrylate (average degree of polymerization 600), 1 part by weight of p-diazodiphenyl amine as crosslinking agent and 0.1 parts by weight of polyoxyethylene alkylphenyl ether (made by Daiichi Kogyo Pharmaceutical Co., Product name "Neugen EA33") with HLB value 4 as surface active agents were mixed, and dispersion liquid A was obtained.

The light-sensitive insulation layer was exposed to light of a mercury-vapor lamp through a mask, then, it was developed by the use of water to eliminate an unexposed insulation layer. Complex (aqueous dispersion liquid 1% by weight) of Baytron P; poly-(ethylene dioxy thiophene) made by Bayer Co. and sulfonated polystyrene was jetted by the ink-jet device of a piezoelectric system to the portion where the unexposed insulation layer was eliminated, and dried to be subjected to heat treatment in atmosphere of nitrogen gas at 120° C. for 3 minutes, thus, a source electrode and a drain electrode were formed. In the aforesaid method, an organic thin-film transistor having channel width W of 3 mm and channel length L of 20 μm was prepared.

This organic thin-film transistor showed excellent operation characteristics of FET of a p channel enhancement type, when it was driven with Si wafer as a gate electrode. When carrier mobility in the saturated area was measured, it was 0.7 cm$^2$/Vs.

Comparative Example (Comparison with Example 4)

After gold was evaporated on pentacene evaporation film in Example 4, gold was subjected to etching through photolithography, and a source electrode and a drain electrode were formed. This element was not driven as FET.

Example 5

Forming on PES by using ablation layer (PVA+CB)

Semiconductor=polythiophene

An aluminum film having a thickness of 300 nm and a width of 300 μm was formed on a 150 μm-thick PES film by a sputtering method, to be a gate electrode material. Then, anodizing was conducted in an aqueous solution of 30% by weight of sulfuric acid for 2 minutes by using D.C. current supplied from a 30V low voltage power supply, so that a thickness of an anode oxidation film may become 120 nm. Further, vapor sealing of oxide coating was conducted in the saturated vapor chamber at 100° C. under one atmospheric pressure, and a silicon oxide film having a thickness of 30 nm was formed by an atmospheric pressure plasma method. A chloroform solution of regioregular isomer (made by Aldrich Co.) of well-defined poly (3-hexylthiophene) was prepared, and it was coated on the surface of the silicon oxide film in the atmosphere of N2 gas by the use of an applicator, and heat treatment at 50° C. was conducted for 30 minutes, after drying at room temperature. In this case, a thickness of poly (3-hexylthiophene) was 50 nm. Further, following composition B was coated on the surface of poly (3-hexylthiophene) film by the use of an applicator, and it was dried, thus, a light-sensitive insulation layer (thickness 0.4 μm, light transmittance 1%) was formed.

(Composition liquid B)

Some 20 parts by weight of carbon black, 5 parts by weight of polyoxy ethylene alkyl phenyl ether (made by Daiichi Kogyo Pharmaceutical Co., Product name "Neugen EA177") with HLB value of 17 as surface active agents, 30 parts by weight of polyvinyl alcohol and 75 parts by weight of water were mixed, and dispersed by a sandmill, thus, composition liquid B was obtained.

Next, when a pattern of a source electrode and a drain electrode in the diagram was exposed to light of a semiconductor laser with oscillation wavelength of 830 nm and output of 100 mW at energy density of 400 mJ/cm$^2$, a light-sensitive insulation layer on the exposed portion was ablated. An aqueous dispersion liquid (Baytron P made by Bayer Co.) of sulfonated polystyrene and poly (ethylene dioxy thiophene) was jetted by an ink-jet device of a piezoelectric system on the exposed portions, and after drying, they were dried at 100° C. in the atmosphere of nitrogen gas, thus, a source electrode and a drain electrode were formed. Further, a toluene dispersion liquid of gold fine-grain (average grain size 15 nm) was jetted on the formed source electrode and drain electrode by the use of an ink-jet device of a piezoelectric system, and after drying, the dispersion liquid was subjected to heat treatment at 200° C. for 15 minutes in the atmosphere of nitrogen gas, and it was cemented respectively to the source electrode and the drain electrode. With respect to each electrode, a fusion layer of Ag fine-grain having a thickness of 300 nm is laminated on the 20 nm-thick layer composed of sulfonated poly styrene and poly (ethylene dioxy thiophene).

This organic thin-film transistor showed excellent operation characteristics of FET of a p channel enhancement type. When carrier mobility in the saturated area was measured, it was 0.09 cm$^2$/Vs.

Example 6

In the same way as in Example 5 except that the second insulation layer was changed to the following, 20 parts by weight of carbon black, 50 g of novolak resin and 100 g of ethyleneglycol monomethyl ether were mixed, and then, dispersed by a sandmill. The composition liquid C thus prepared was processed at 120° C. for 10 minutes, and thereby, second insulation layer 4 having a thickness of 0.2 μm was formed.

This organic thin-film transistor showed excellent operation characteristics of FET of a p channel enhancement type. When carrier mobility in the saturated area was measured, it was 0.02 cm$^2$/Vs.

Comparative Example

Light-sensitive polyimide was coated on a 150 μm-thick PES film, and a polyimide film having a width of 20 μm and a thickness of 0.3 μm was formed by the photoresist method. After heat treatment at 100° C. for 5 minutes, aqueous dispersion liquid (Baytron P made by Bayer Co.) of complex of sulfonated polystyrene and poly (ethylene dioxy thiophene) was jetted on both edges of PVA film by an ink-jet device of a piezoelectric system, and after drying, they were dried at 100° C. in the atmosphere of nitrogen gas, thus, a source electrode and a drain electrode were formed.

A chloroform solution of regioregular isomer (made by Aldrich Co.) of well-defined poly (3-hexylthiophene) was prepared, and it was coated on the surface of the silicon oxide film in the atmosphere of N2 gas by the use of an applicator, and heat treatment at 50° C. was conducted for 30 minutes, after drying at room temperature. In this case, a thickness of poly (3-hexylthiophene) was 50 nm.

After providing a silicon oxide layer having a thickness of 200 nm by the aforesaid atmospheric pressure plasma method, Baytron P stated above was jetted by the ink-jet device, and dried at 100° C. in the atmosphere of nitrogen gas after being dried, thus, a gate electrode was formed. When carrier mobility in the saturated area was measured, it was 0.002 cm$^2$/Vs.

Compared with organic thin-film transistors formed by the conventional method, those formed by the method in the invention can be patterning-formed through more simple process and more efficiently by the use of coating. Therefore, the manufacturing process does not require vast facilities, and it is possible to conduct highly accurate patterning at low cost efficiently.

Further, dispersion is less when constituting as a total element, because electrode pattern forming is excellent in accuracy despite formation of a constituent layer such as an organic semiconductor layer by a simple method such as coating.

As stated above, the invention makes it possible to obtain an organic thin-film transistor in which carrier mobility is high, an ON/OFF value of an electric current is high and a switching function is excellent, and a manufacturing method of the organic thin-film transistor wherein highly accurate patterning can be conducted at low cost without passing through the complicated process, and deterioration of characteristics of a transistor can be controlled in the manufacturing process.

Disclosed embodiment can be varied by a skilled person without departing from the spirit and scope of the invention.

What is claimed is:

1. An organic thin-film transistor fabricated on a substrate, comprising:

a first insulating layer formed on said substrate;

an organic semiconductor layer formed on said first insulating layer;

a second insulating layer formed on said organic semiconductor layer;

a first through-hole bored through said second insulating layer;

a second through-hole bored through said second insulating layer;

a source electrode embedded in said first through-hole, a depth of which is equal to or greater than a thickness of said second insulating layer so that said source electrode contacts said organic semiconductor layer; and a drain electrode embedded in said second through-hole, a depth of which is equal to or greater than a thickness of said second insulating layer so that said drain electrode contacts said organic semiconductor layer.

2. The organic thin-film transistor of claim 1, further comprising:

a gate electrode embedded in said first insulating layer.

3. The organic thin-film transistor of claim 1, wherein said second insulating layer is made of a photosensitive material.

4. The organic thin-film transistor of claim 1, wherein said second insulating layer is a coating film formed by applying a solvent, which includes a water as a main ingredient.

* * * * *